(12) United States Patent
Piwczyk

(10) Patent No.: US 7,135,069 B2
(45) Date of Patent: *Nov. 14, 2006

(54) COATING SILICON PELLETS WITH DOPANT FOR ADDITION OF DOPANT IN CRYSTAL GROWTH

(75) Inventor: Bernhard P. Piwczyk, Dunbarton, NH (US)

(73) Assignee: Schott Solar, Inc., Billerica, MA (US)

( * ) Notice: Subject to any disclaimer, the term of this patent is extended or adjusted under 35 U.S.C. 154(b) by 203 days.

This patent is subject to a terminal disclaimer.

(21) Appl. No.: 10/793,539

(22) Filed: Mar. 4, 2004

(65) Prior Publication Data

US 2004/0168625 A1 Sep. 2, 2004

Related U.S. Application Data

(63) Continuation-in-part of application No. 10/142,312, filed on May 9, 2002, now Pat. No. 6,740,158.

(51) Int. Cl.
*C30B 15/02* (2006.01)

(52) U.S. Cl. ............................ 117/13; 117/18; 117/19; 117/23; 117/33; 117/932; 427/215; 427/220

(58) Field of Classification Search ................ 117/13, 117/18, 19, 23, 33, 932; 427/215, 220
See application file for complete search history.

(56) References Cited

U.S. PATENT DOCUMENTS

| 3,615,943 | A |   | 10/1971 | Genser |
| 3,630,793 | A |   | 12/1971 | Christensen et al. |
| 4,330,358 | A | * | 5/1982 | Grabmaier et al. ............ 438/97 |
| 4,357,200 | A | * | 11/1982 | Grabmaier .................... 438/62 |
| 4,357,201 | A | * | 11/1982 | Grabmaier et al. ............ 438/62 |
| 5,135,887 | A |   | 8/1992 | Delage et al. |
| 5,763,320 | A |   | 6/1998 | Stevens et al. |
| 6,740,158 | B1 | * | 5/2004 | Piwczyk ....................... 117/18 |

* cited by examiner

*Primary Examiner*—Robert Kunemund
(74) *Attorney, Agent, or Firm*—Pandiscio & Pandiscio

(57) ABSTRACT

An inexpensive method of coating silicon shot with boron atoms comprises (1) immersing silicon shot in an aqueous solution comprising a boric acid and polyvinyl alcohol, and (2) heating the solution so as to evaporate water and form a polymerized polyvinyl alcohol coating containing boron on the shot. A precise amount of this coated shot may then be mixed with a measured quantity of intrinsic silicon pellets and the resulting mixture may then be melted to provide a boron-doped silicon melt for use in growing p-type silicon bodies that can be converted to substrates for photovoltaic solar cells.

16 Claims, No Drawings

COATING SILICON PELLETS WITH DOPANT FOR ADDITION OF DOPANT IN CRYSTAL GROWTH

This application is a continuation in part of my U.S. application Ser. No. 10/142,312 filed 9 May 2002 (now Publication No. U.S. 2003/0209188 A1, published 13 Nov. 2003) now U.S. Pat. No. 6,740,158.

This invention was made under DOE Subcontract No. ZAX-8-17647-10.

FIELD OF THE INVENTION

This invention relates to growing crystalline bodies of silicon from a melt, e.g., by the Edge-Defined Film-Fed Growth (EFG) Process, and more particularly to the provision of a selected dopant in a melt of silicon.

BACKGROUND OF THE INVENTION

The EFG process is well known, as evidenced by the following U.S. Pat. Nos. 4,230,674; 4,661,324; 4,647,437; 4,968,380; 5,037,622; 5,098,229; 5,106,763; 5,156,978; and 5,558,712. In the EFG process, crystalline bodies having a predetermined cross-sectional shape, e.g., tubes of octagonal cross-sectional shape, are grown on a seed from the liquid film of a selected material which is transported by capillary action from a melt contained in a crucible to the top end surface of an EFG die. In order to grow relatively large tubes, e.g., tubes of octagonal cross-sectional shape measuring 4–6 inches on each flat side and 15–20 feet in length, it is necessary to replenish the melt during the growth process, with the replenishment being conducted so as to keep the level of the molten silicon substantially constant in the crucible containing the melt. The silicon feedstock used in growing silicon tubes is typically in the form of substantially spherical pellets ("shot") having a diameter in the order of 2 mm. The common practice is to deliver additional feedstock to the crucible on an intermittent basis according to the rate of consumption of the melt, so as to maintain the level of the melt in the crucible within predetermined limits.

The EFG process has been used extensively to grow silicon tubes, e.g., tubes of octagonal and nonagonal shape, and those tubes are subdivided by cutting out square or rectangular wafers from their flat sides. Those wafers are then used as substrates to form individual photovoltaic cells. U.S. Pat. Nos. 4,751,191, 5,106,763, 5,270,248 and 5,320,684 illustrate methods used to manufacture silicon solar cells from wafers cut out of EFG-grown tubes.

The EFG wafers used for making solar cells are p-type silicon having a bulk resistivity in the range of 2 to 4 ohm-cm, with the p-type conductivity and desired resistivity being due to the presence of boron dopant in the melt. The ratio of silicon to dopant atoms required for producing a bulk resistivity of 2 to 4 ohm-cm is very large, approximately eight orders of magnitude. This requires careful control of the quantity and method of introduction of dopant into the silicon melt. For years doping the melt was achieved by adding a small, carefully measured, amount of silicon pellets (also referred to as "shot") highly doped with boron to a predetermined quantity of intrinsic (pure) silicon feedstock (also in the form of pellets), with the amount of highly doped silicon pellets being set to achieve the doping level required to grow tubes of desired resistivity. The mixture of doped silicon shot and pure silicon feedstock was intermixed and dissolved to form a melt, with the boron in the doped silicon shot being dissolved uniformly throughout the melt.

However, highly doped silicon shot is expensive and difficult to obtain. For these reasons, it was deemed necessary to find an alternative and less expensive method of providing boron-doped silicon shot suitable for doping a silicon melt. One such method is described in my copending U.S. patent application Ser. No. 10/142,312, filed 9 May 2002 (Publication No. U.S. 2003/0209188 A1, published 13 Nov. 2003). That method comprises (1) immersing intrinsic silicon shot in a spin-on dopant solution that consists essentially of a borosilicate in a volatile organic solvent, plus a polymer precursor, and (2) removing the solvent so as to leave a polymeric coating or film containing boron on the shot. The boron-coated shot is then intermixed and melted with a measured quantity of intrinsic silicon pellets to provide a boron-doped silicon melt for use in growing silicon tubes of suitable resistivity.

A significant limitation of the foregoing method is that its use of a volatile organic solvent presents an environmental and safety problem.

OBJECTS AND SUMMARY OF THE INVENTION

The primary object of the invention is to provide a method of producing boron-doped silicon shot that overcomes the limitation of the method described in published U.S. Patent Application Publication No. 2003/0209188 A1.

A more specific object is to provide an improved method of adding boron to silicon shot, whereby the resulting boron-doped silicon shot can be intermixed and melted with a silicon feedstock to provide a silicon melt having a doping level calculated to assure growth of shaped crystalline bodies with a desired resistivity.

Another specific object of the invention is to provide an inexpensive and easy to execute method of coating intrinsic silicon shot with a boron-containing organic polymer layer.

A further object is to provide doped silicon pellets for mixing and melting with intrinsic silicon feedstock, whereby to provide a silicon melt of with a selected doping level.

These and other objects of the invention are achieved by providing an aqueous solution of selected pH comprising boric acid and polyvinyl alcohol, combining the aqueous solution with a measured quantity of intrinsic silicon pellets so as to form a mixture thereof, heating that mixture to a temperature at which volatile constituents of the aqueous solution are removed by evaporation and the polyvinyl alcohol polymerizes and forms a thin boron-containing coating on the pellets, and discontinuing the heating after the coating on the silicon pellets is dry and the pellets are free-flowing. Those coated pellets are then mixed and melted with a larger quantify of intrinsic silicon pellets to provide a boron-doped silicon melt for use in growing silicon bodies with a selected bulk resistivity. Melting of the silicon pellets is accompanied by decomposition and volatilization of the polyvinyl alcohol. Other details and features of the present invention are set forth in or rendered obvious by the following detailed description of a preferred embodiment of the invention.

DETAILED DESCRIPTION OF THE INVENTION

As noted above, in growing crystalline bodies for use in manufacturing photovoltaic cells, the quantity of boron dopant in the silicon melt must be carefully controlled so as to match the bulk resistivity requirements of the grown crystalline body and the dopant must be uniformly distributed throughout that body. These requirements are met by the present invention.

The method of this invention is straightforward and requires no specially-made equipment. A precisely measured amount of previously cleaned intrinsic silicon shot is placed in a clean container and then an accurately measured amount of an aqueous dopant solution is added that comprises boric acid and polyvinyl alcohol, with the quantity of boric acid being accurately measured to provide a predetermined concentration of boron in the solution. The amount of the added boron-containing solution and the weight of the intrinsic silicon shot are calculated such that the weight of boron and the weight of silicon are in a specific ratio. Additional deionized water may be added as required to assure that all of the silicon shot is covered by the solution. The contents of the container are mixed by stirring, gentle shaking or rotation to assure uniform distribution of boron and silicon. Then the contents of the container are heated so as to slowly effect removal of water and other volatile constituents by evaporation and formation of a boron-containing polyvinyl alcohol polymer coating on the pellets. The heating and stirring are continued until the coating on the silicon shot is dry and pellets move freely. At this point, the particles of silicon shot are substantially uniformly coated. The evaporation process is carried out close to the boiling point of water, so that no boron is lost during the evaporation process. The resulting boron-coated silicon shot may now be used as a source of boron dopant for a silicon melt.

As with the practice described in my published U.S. Patent Application Publication No. 2003/0209188, doping of a silicon melt using the boron-doped shot produced by the present invention is accomplished by weighing a precise amount of the boron-doped shot and adding that boron-doped shot to a measured quantity of a silicon feedstock in pellet form, and then thoroughly mixing the two to achieve a uniform distribution of coated shot throughout the mass of uncoated feedstock. The ratio of coated shot to the silicon feedstock is measured such that the concentration of boron is at the level required to achieve a desired bulk resistivity in the grown crystalline body. For growing crystalline bodies that can be used as solar cell substrates, the concentration is set to provide a bulk resistivity of between 2 and 4 ohm-cm, preferably about 3.0 ohm-cm. However, the amount of dopant added to the intrinsic silicon may be set to provide a different resistivity, e.g., a resistivity of 1 ohm-cm.

The growth of EFG silicon tubes is on a batch basis, with each tube being grown to a particular length determined by the growth apparatus and the amount of doped silicon feedstock supplied to the crucible. Typically the silicon feedstock for growing a single silicon tube is supplied to the crucible in batches weighing 3.0 kilograms. Since the ratio of silicon to dopant atoms in 2–4 ohm-cm silicon solar cell wafers is large, approximately eight orders of magnitude, the amount of doped silicon shot required to be added to a 3.0 kilogram supply of silicon feedstock to produce silicon tubes with a resistivity in the range of 2 to 4 ohm-cm is small, with the amount varying according to the concentration of boron atoms in the doped silicon shot. According to the preferred mode of practicing the present invention, the amount of boric acid in the liquid dopant and the amount of that liquid dopant that is mixed with the silicon pellets are selected using as a guideline the addition of about 1.0 gram of doped silicon pellets to each 3.0 kg. of silicon feedstock to achieve a melt for growing crystalline silicon bodies with a bulk resistivity in the range of 2 to 4 ohm-cm. By way of example, in order to obtain a bulk resistivity of about 3.0 ohm-cm, the concentration of electronically active boron atoms in the grown silicon body needs to be about $4.56 \times 10^{15}/cm^3$.

For reasons of efficiency and cost, it is preferred that the method of producing doped silicon pellets according to this invention be practiced by doping a relatively large quantity of intrinsic silicon pellets, enough to satisfy the dopant needs of many 3 kg batches of silicon feedstock. More specifically, assuming that 1.0 gram of doped silicon pellets is to be added to each 3.0 kg of feedstock, doping 3 kg of pellets will provide enough doped pellets for doping 9,000 kg. of silicon pellet feedstock.

Following is a specific example of how to practice the invention based on the desirability of producing boron-doped silicon pellets in batches large enough to satisfy many batches of silicon feedstock and the current practice of doping silicon pellet feedstock in 3 kg. batches. In this example, one (1) liter of aqueous dopant is prepared, sufficient to coat twenty (20) 3 kg batches of silicon with boron.

EXAMPLE

A. Formation of Dopant Solution

One (1) liter of aqueous boron-containing solution is formed by combining separate 500 ml. aqueous solutions of boric acid and polyvinyl alcohol ("PVA"), with each of those solutions having its pH set in the range of between 8 and 9 by addition of 5 N sodium hydroxide solution. The sodium hydroxide is added to aid in the dissolution of the PVA. The boric acid, PVA and sodium hydroxide each have a 99.+% purity, and the solutions are made with deionized ("DI") water. By way of example but not limitation, the average molecular weight of the PVA is in the range of 89,000–98,000). The boric acid solution is made by adding 40.00 grams of boric acid to 500 ml of DI water while the water is at near boiling temperature, and sodium hydroxide solution is added as required to obtain a pH of 8–9. The PVA solution is made by adding 5.0 grams of PVA to 500 ml of water while the water is at near boiling temperature, and sodium hydroxide solution is added as required to obtain a pH of 8–9. Thereafter the PVA solution is slowly added to the boric acid solution with continuous heating and stirring. The mixing and heating is terminated after all of the PVA solution has been added and the resulting mixture is completely clear. Since some water will have evaporated, the total volume may be less than 1,000 ml, in which case additional DI water is added to bring the total volume up to one liter. If, due to the addition of sodium hydroxide solution, the total volume should be in excess of 1000 ml, the heating and stirring is continued until the total volume is reduced to one liter. This dopant solution is then allowed to cool and set aside until dopant is needed for the preparation of dopant pellets.

It is contemplated that silicon pellet will be doped in 3 kg batches and that 50 ml of dopant solution will be used to dope each 3 kg silicon batch. Therefore, one liter of dopant solution is adequate to produce twenty (20) 3 kg batches of dopant pellets. On a theoretical basis having 36.166 grams of boric acid in the dopant solution is adequate to produce a bulk resistivity of about 3 ohm-cm when the one gram of doped pellets is mixed with 3 kg of silicon pellet feedstock. However, that calculation assumes that all of the boron will be electronically active, which in reality is not the case. Increasing the amount of boric acid to 40 grams as described above makes it possible to achieve a resistivity of about 3.0 ohm-cm.

B. Doping Silicon Pellets With Boron

A supply of intrinsic silicon pellets is sifted to segregate pellets with a diameter in the range of 0.5 to 0.6 mm. Those segregated pellets are washed to remove any silicon dust. Then a batch of those pellets weighting 3.0 grams is placed in a quartz or glass container together with 500 ml of DI water. Next 50 ml of the aqueous dopant solution produced as described in section A above is added to the container. Then the resulting mixture is heated to a gentle boil with continuous stirring, causing the water to slowly evaporate and boron to be incorporated in a polymerized PVA coating formed on the pellets. The heating and stirring are continued for about ten (10) minutes past the point where all of the pellets appear to be dry and free-flowing, and then allowed to cool to room temperature, after which they may be used immediately or stored, preferably in a refrigerator at a cold but non-freezing temperature.

C. Adding Boron-Doped Pellets to Silicon Feedstock

The boron-coated pellets produced according to the foregoing paragraphs are used to supply boron to intrinsic silicon pellet feedstock. The doped pellets are combined with intrinsic silicon pellet feedstock in the ratio of one (1) gram of the boron coated pellets for each three (3) kg. batch of feedstock, and the resulting mixture is then introduced into the melt crucible of an EFG growth apparatus and melted to provide liquid silicon doped with boron. The average diameter of the intrinsic silicon pellets is about 2.0 mm. Melting of the silicon pellets is accompanied by decomposition and volatilization of the polyvinyl alcohol, leaving boron in the silicon melt. Crystal growth according to the EFG process results in production of a boron-doped silicon tube, with the boron being incorporated at crystal lattice sites such that it is electronically active, with the result that the tube has a bulk resistivity of approximately 3.0 ohm-cm.

The invention herein described has the advantage of avoiding the use of an organic solvent which presents a hazardous waste disposal problem. A further advantage is that it replaces a relatively costly organic solvent with water. Still another advantage if the invention is that it is easy to practice and may be scaled up or down as desired. A further advantage of the invention is that the amount of doped pellets added to a quantity of undoped intrinsic silicon feedstock can be varied to achieve to achieve a resistivity greater or less than 3 ohm-cm.

The invention also is subject to modification. In this connection it should be noted that having the pH of the dopant solution in the range of 8 to 9 is necessary in order to facilitate complete dissolution of the polyvinyl alcohol. However, pH control may be achieved by using some other base than sodium hydroxide, notably ammonium or potassium hydroxide. The size of the silicon pellets that are subjected to coating also may be varied. Also the boric acid may be replaced by other chemical compounds for providing either p or n type doping, e.g., compounds that supply phosphorus or arsenic atoms. Still other advantages and modifications will be obvious to persons skilled in the art from the foregoing detailed description.

What is claimed is:

1. Method of coating silicon pellets with a selected dopant for use in adding that dopant to a silicon melt comprising the steps of:

forming an aqueous solution comprising a compound containing a selected dopant and polyvinyl alcohol;

combining said aqueous solution with a measured quantity of silicon pellets in a container so as to form a mixture thereof;

heating said mixture to a temperature at which the aqueous solution evaporates and the polyvinyl alcohol polymerizes, whereby the pellets are coated with a dopant-containing coating of polymerized polyvinyl alcohol; and discontinuing the heating after the dopant-containing coating of polymerized polyvinyl alcohol is dry and the coated silicon pellets are free-flowing.

2. Method according to claim 1 wherein the dopant is boron, phosphorus or arsenic.

3. Method according to claim 1 wherein said compound contains boron.

4. Method of coating silicon pellets with boron dopant for use in adding boron dopant to a silicon melt comprising the steps of:

forming an aqueous solution comprising a compound containing boric acid and polyvinyl alcohol;

combining said aqueous solution with a measured quantity of silicon pellets in a container so as to form a mixture thereof;

heating said mixture to a temperature at which the aqueous solution evaporates and the polyvinyl alcohol polymerizes, whereby the pellets are coated with a boron-containing coating of polymerized polyvinyl alcohol; and discontinuing the heating after the boron-containing coating of polymerized polyvinyl alcohol is dry and the coated silicon pellets are free-flowing.

5. Method according to claim 4 wherein the pellets are subjected to continued movement in the mixture as it is being heated.

6. Method according to claim 4 wherein said solution has a pH of between about 8 and about 9.

7. Method according to claim 4 wherein said solution also comprises sodium hydroxide.

8. Method according to claim 4 wherein said pellets have an average diameter in the range of about 0.5 to about 0.6 mm.

9. Method of adding boron dopant to a silicon feedstock comprising adding a predetermined amount of silicon pellets coated according to the method of claim 1 to a predetermined quantity of intrinsic silicon pellets, and mixing said coated silicon pellets and said intrinsic silicon pellets so that said coated silicon pellets are dispersed uniformly throughout said quantity of intrinsic silicon pellets.

10. Method of claim 9 wherein said predetermined amount of coated silicon pellets and said predetermined quantity of intrinsic silicon pellets are such as to provide a concentration of boron that will provide a resistivity of approximately 2 to 4 ohm-cm in silicon bodies that are grown from a melt formed by melting said boron-doped and said intrinsic silicon pellets.

11. Method according to claim 9 wherein said boron-doped pellets have an average diameter of between about 0.5 and about 0.6 mm and said intrinsic silicon pellets have an average diameter of about 2.0 mm.

12. Method of coating silicon shot with boron dopant for use in adding dopant to a silicon melt comprising the steps of:

combining in a container (1) a solution comprising boric acid and polyvinyl alcohol having a pH of between about 8 and about 9 and (2) a measured quantity of clean silicon pellets so as to form a mixture thereof;

heating said mixture to a temperature sufficient to removal of the solution by evaporation;

moving the pellets as they are being heated so as to prevent agglomeration thereof; and terminating the heating after the solution has been fully evaporated and the pellets are dry and free moving.

13. Method according to claim 12 wherein said solution contains sodium hydroxide, potassium hydroxide or ammonium hydroxide.

14. Method according to claim 12 wherein said silicon shot has an average diameter of between about 0.5 and about 0.6 mm.

15. Method of producing a silicon melt comprising:
producing coated silicon pellets according to the method of claim 1;
combining a selected quantity of said coated silicon pellets with a measured quantity of intrinsic silicon feedstock in particle form so as to form a mixture of said coated silicon pellets and said silicon feedstock, and
heating said mixture to form a silicon melt.

16. Silicon pellets having a coating comprising polymerized PVA and a selected dopant from the class consisting of boron, phosphorus and arsenic.

* * * * *